United States Patent
Kim

(10) Patent No.: US 11,611,028 B2
(45) Date of Patent: Mar. 21, 2023

(54) THERMOELECTRIC DEVICE AND MANUFACTURING METHOD THEREFOR

(71) Applicant: LG INNOTEK CO., LTD., Seoul (KR)

(72) Inventor: Tae Hee Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 20 days.

(21) Appl. No.: 16/078,459

(22) PCT Filed: Mar. 3, 2017

(86) PCT No.: PCT/KR2017/002312
§ 371 (c)(1),
(2) Date: Aug. 21, 2018

(87) PCT Pub. No.: WO2017/150932
PCT Pub. Date: Sep. 8, 2017

(65) Prior Publication Data
US 2019/0097113 A1    Mar. 28, 2019

(30) Foreign Application Priority Data

Mar. 4, 2016 (KR) .......................... 10-2016-0026593

(51) Int. Cl.
*H01L 35/32* (2006.01)
*H01L 35/34* (2006.01)

(52) U.S. Cl.
CPC .............. *H01L 35/32* (2013.01); *H01L 35/34* (2013.01)

(58) Field of Classification Search
CPC ................................. H01L 35/32; H01L 35/34
See application file for complete search history.

(56) References Cited

U.S. PATENT DOCUMENTS

2006/0289051 A1* 12/2006 Niimi ...................... H01L 35/10
                                                            136/203
2007/0227158 A1* 10/2007 Kuchimachi ........... H01L 35/32
                                                            62/3.7
(Continued)

FOREIGN PATENT DOCUMENTS

| JP | 2009-289860 A | 12/2009 |
| KR | 10-0658699 B1 | 12/2006 |
| KR | 10-2011-0083372 A | 7/2011 |

(Continued)

OTHER PUBLICATIONS

International Search Report in International Application No. PCT/KR2017/002312, filed Mar. 3, 2017.

(Continued)

*Primary Examiner* — Tamir Ayad
(74) *Attorney, Agent, or Firm* — Saliwanchik, Lloyd & Eisenschenk

(57) ABSTRACT

A thermoelectric device and a manufacturing method thereof according to one embodiment of the present invention are disclosed. The thermoelectric device includes a plurality of upper electrodes and a plurality of lower electrodes, and an N-type thermoelectric material and a P-type thermoelectric material which are electrically connected, alternately arranged between the upper electrodes and the lower electrodes, and obliquely disposed on the lower electrode.

11 Claims, 5 Drawing Sheets

(56) References Cited

U.S. PATENT DOCUMENTS

2011/0168224 A1\* 7/2011 Cho ................ H01L 35/32
　　　　　　　　　　　　　　　　　　　　136/212
2014/0246066 A1\* 9/2014 Chen ............... H01L 35/34
　　　　　　　　　　　　　　　　　　　　136/212

FOREIGN PATENT DOCUMENTS

KR　　10-2014-0110410 A　　9/2014
KR　　　　10-1460432 B1　　11/2014
KR　　　　10-1460880 B1　　11/2014

OTHER PUBLICATIONS

Office Action dated Nov. 22, 2021 in Korean Application No. 10-2016-0026593.

\* cited by examiner

THERMOELECTRIC DEVICE AND MANUFACTURING METHOD THEREFOR

CROSS-REFERENCE TO RELATED APPLICATIONS

This application is the U.S. national stage application of International Patent Application No. PCT/KR2017/002312, filed Mar. 3, 2017, which claims the benefit under 35 U.S.C. § 119 of Korean Application No. 10-2016-0026593, filed Mar. 4, 2016, the disclosures of each of which are incorporated herein by reference in their entirety.

TECHNICAL FIELD

The present invention relates to a thermoelectric device and a manufacturing method thereof, and more specifically, to a flexible thermoelectric device and a manufacturing method thereof.

BACKGROUND ART

Thermoelectric conversion refers to energy conversion between thermal energy and electric energy. The Peltier effect is an effect in which a temperature gradient occurs between both ends of a thermoelectric material when a current is applied to the thermoelectric material, and the Seebeck effect is an effect in which electricity is generated by a difference in temperature between both ends of a thermoelectric material.

Various cooling systems which do not need refrigerants may be formed when the Peltier effect is used. A cooling system using the Peltier effect may effectively solve a heating problem which is difficult to solve with a conventional cooling system (a manual cooling system and a refrigerant gas compression system).

In addition, a thermoelectric cooling technology is an eco-friendly cooling technology in which a refrigerant gas, which causes an environmental problem, is not used, and the span of application of the thermoelectric cooling technology may be expanded to general cooling systems such as a refrigerator and an air conditioner when a high efficiency thermoelectric cooling material is developed to improve a thermoelectric cooling efficiency.

Meanwhile, heat generated by a computer, a vehicle engine, an industrial factory, and the like can be converted into electric energy when the Seebeck effect is used. Thermoelectric generation using the Seebeck effect may be applied for a renewable energy source. Recently, as interest in new energy development, waste energy recovery, environmental protection, and the like has heightened, an interest in thermoelectric device has also heightened.

In addition, there has been growing interest in polymer thermoelectric material or flexible thermoelectric material so as to apply the thermoelectric device as a large thermoelectric device or wearable thermoelectric device.

Although the polymer thermoelectric material or flexible thermoelectric material has advantages in that nontoxic material, low cost, and large size thermoelectric devices can be easily formed when compared to an inorganic thermoelectric material and the like, a thermoelectric conversion efficiency may be low.

In addition, a flexible material in which a bulk type thermoelectric material is applied has problems of difficulty in high integration and low reliability due to bending. In addition, a flexible material in which a thin thermoelectric material is applied has problems of low thermoelectric conversion efficiency and flexibility loss when the thin thermoelectric material is modularized.

Technical Problem

The present invention is directed to providing a flexible thermoelectric device with a high thermoelectric conversion efficiency and a manufacturing method thereof.

Technical Solution

One aspect of the present invention provides a thermoelectric device including a plurality of upper electrodes and a plurality of lower electrodes, and an N-type thermoelectric material and a P-type thermoelectric material which are electrically connected, alternately arranged between the upper electrodes and the lower electrodes, and obliquely disposed on the lower electrode.

An angle between the lower electrode and each of the N-type thermoelectric material and the P-type thermoelectric material may be 45° or more.

The N-type thermoelectric material and the P-type thermoelectric material may have different inclinations with respect to the lower electrode.

The N-type thermoelectric material and the P-type thermoelectric material may be symmetrical with respect to a direction perpendicular to the upper electrode and the lower electrode.

The thermoelectric device may further include a support layer interposed between the N-type thermoelectric material and the P-type thermoelectric material.

The support layer may include a polyimide.

The thermoelectric device may further include an insulating layer disposed on the support layer and interposed between the plurality of upper electrodes.

The insulating layer may connect the upper electrodes and may be flexible.

Another aspect of the present invention provides a method of manufacturing a thermoelectric device including forming a sacrificial layer on a substrate, forming lower electrodes on the sacrificial layer, forming a support layer configured to support an N-type thermoelectric material and a P-type thermoelectric material which are alternately arranged and obliquely disposed on the lower electrodes such that the N-type thermoelectric material and the P-type thermoelectric material are formed on the lower electrodes, depositing the N-type thermoelectric material and the P-type thermoelectric material on the support layer, removing the substrate, and connecting upper electrodes to electrically connect the N-type thermoelectric material and the P-type thermoelectric material.

The forming of the support layer may include placing a mold on the lower electrode and injecting a polyimide into the mold.

The depositing of the N-type thermoelectric material and the P-type thermoelectric material may include any one of a shadow mask process and a lithograph process.

Advantageous Effects

As described above, since a path of carriers in a thermoelectric material is parallel to a grain boundary, an electric conductivity can increase. In addition, since distances between electrodes are widened, a heat transfer path increases, an increase in thermal conductivity is offset due to the increase in heat transfer path, and thus a temperature difference between the electrodes of the thermoelectric device can increase.

Therefore, the thermoelectric device with an improved thermoelectric performance index (ZT) can be provided.

In addition, by using the flexible electrodes and flexible support layers configured to support the thermoelectric material, reliability of the thermoelectric device can be overcome with respect to flexibility thereof.

In addition, the thermoelectric material can be made in a thin film type and can thus be highly integrated.

MODES OF THE INVENTION

Figure 1:
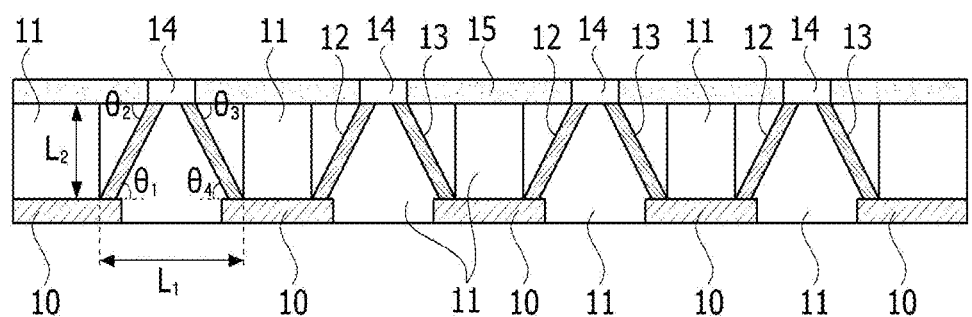
FIG. 1 is a cross-sectional view illustrating a thermoelectric device according to one embodiment of the present invention.

While the present invention may be modified in various ways and take on various alternative forms, specific embodiments thereof are shown in the drawings and described in detail below. However, it should be understood that there is no intent to limit the present invention to the particular forms disclosed, but on the contrary, the present invention covers all modifications, equivalents, and alternatives falling within the spirit and scope of the present invention.

It will be understood that, although the terms "first," "second," etc. may be used herein to describe various elements, these elements should not be limited by these terms. These terms are only used to distinguish one element from another. For example, a first element could be termed a second element, and a second element could similarly be termed a first element without departing from the scope of the present invention. As used herein, the term "and/or" includes any one or all combinations of one or more of the associated listed items.

It will be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements.

The terminology used herein is for the purpose of describing particular embodiments only and is not intended to be limiting to the invention. As used herein, the singular forms "a," "an" and "the" are intended to include the plural forms as well, unless the context clearly indicates otherwise. It will be further understood that the terms "comprises," "comprising," "includes," and/or "including," when used herein, specify the presence of stated features, integers, steps, operations, elements, components, and/or groups thereof but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined here.

Example embodiments of the invention will be described below in more detail with reference to the accompanying drawings. Those components that are the same or are corresponding are rendered the same reference numeral regardless of the figure number, and redundant explanations are omitted.

Figure 2:
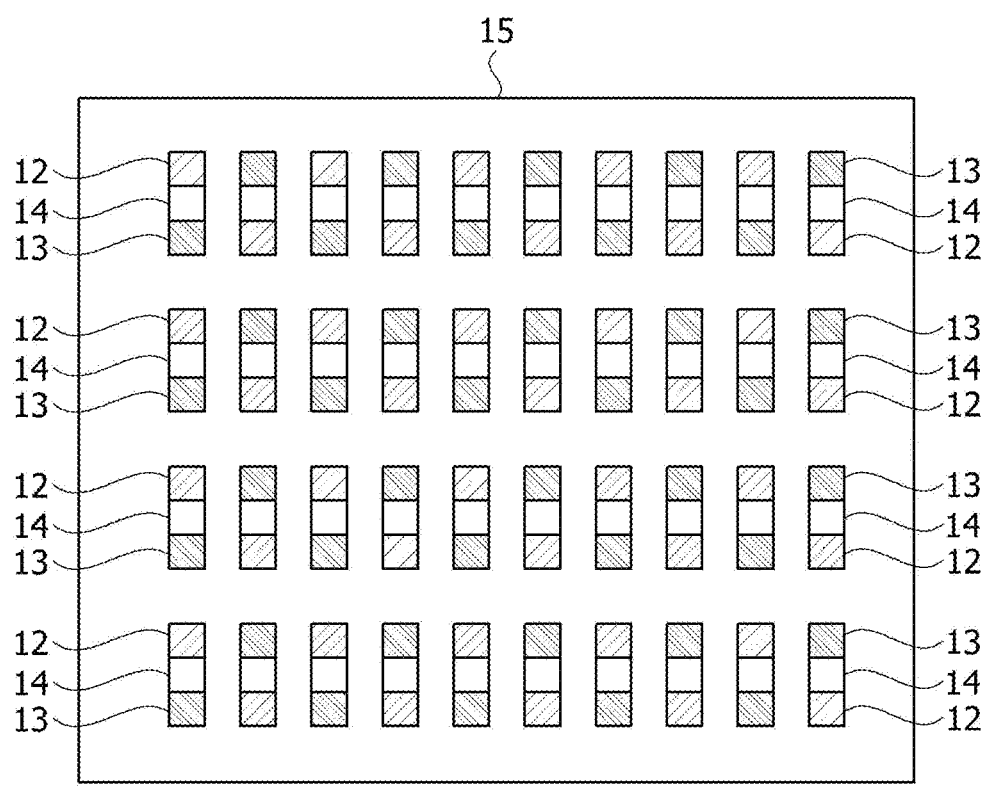
FIG. 2 is a top view illustrating the thermoelectric device according to one embodiment of the present invention.
Figure 3:
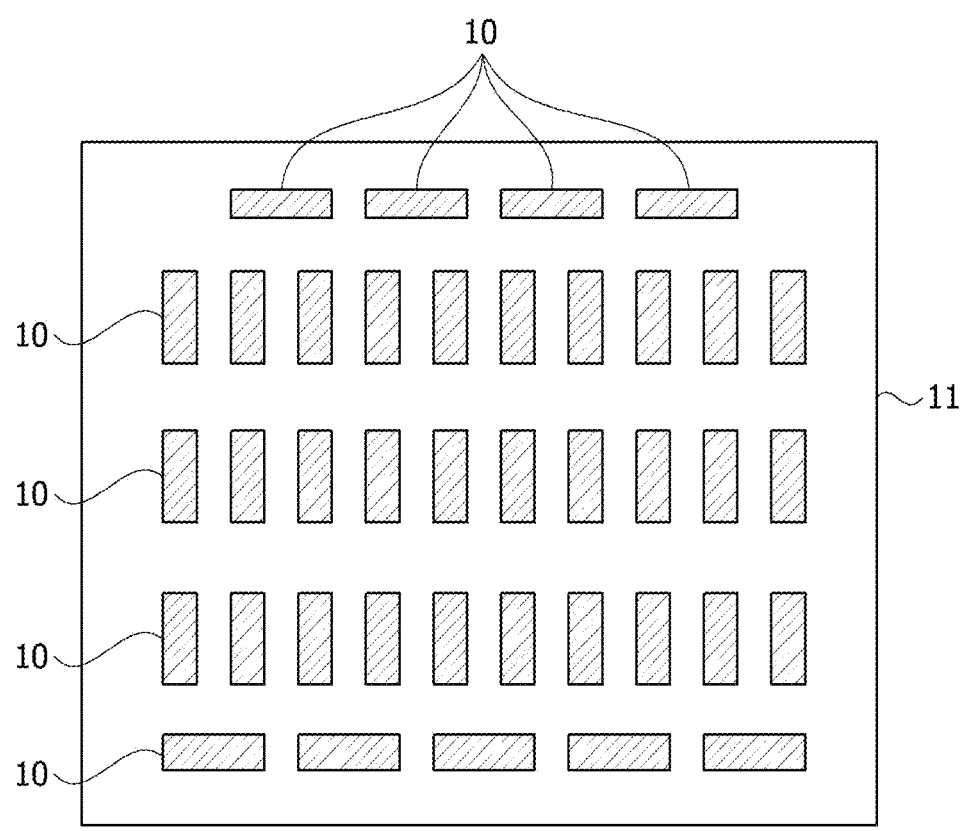
FIG. 3 is a bottom view illustrating the thermoelectric device according to one embodiment of the present invention.
Figure 4:
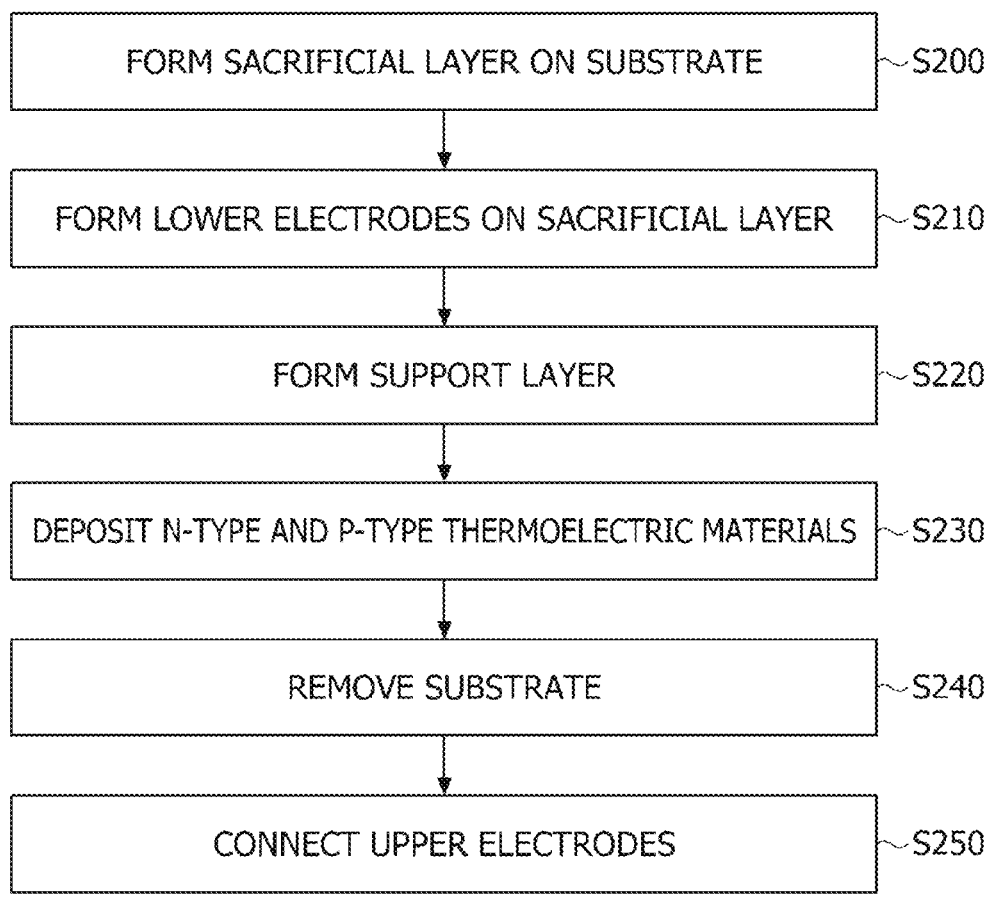
FIGS. 4 to 10 are cross-sectional views illustrating the thermoelectric device for describing a method of sequentially manufacturing the thermoelectric device according to one embodiment of the present invention.
Figure 5:
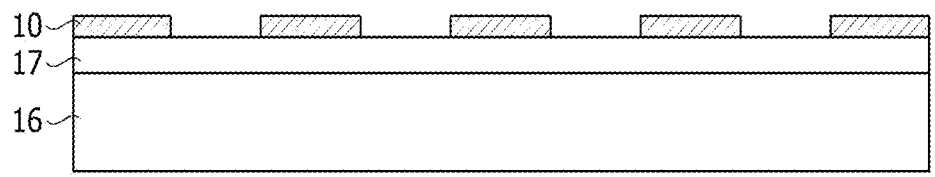
Figure 6:
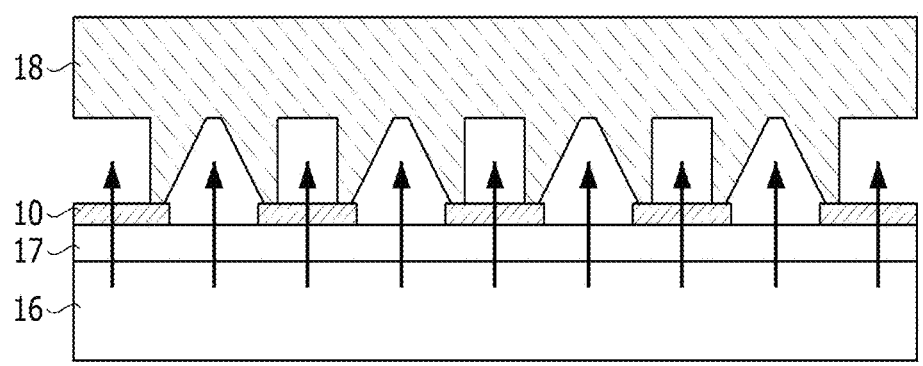

FIG. 1 is a cross-sectional view illustrating a thermoelectric device according to one embodiment of the present invention, FIG. 2 is a top view illustrating the thermoelectric device according to one embodiment of the present invention, and FIG. 3 is a bottom view illustrating the thermoelectric device according to one embodiment of the present invention.

Referring to FIG. 1, the thermoelectric device according to one embodiment of the present invention includes lower electrodes 10, a support layer 11, an N-type thermoelectric material 12, a P-type thermoelectric material 13, upper electrodes 14, and an insulating layer 15.

When a current is supplied to the thermoelectric device, electrons (e−) and holes (h+), which are carriers, are generated from one electrode, and the electrons in the case of the N-type thermoelectric material or the holes in the case of the P-type thermoelectric material move to transfer heat and recombine at the other electrode. Active cooling occurs at the electrode at which the carriers are generated and a substrate adjacent to the electrode, heat rejection occurs at the electrode at which the carriers are recombined and a substrate adjacent to the electrode. These portions may be referred to as a cold side and a hot side, and form both surfaces of the thermoelectric device.

In addition, a thermoelectric performance index ZT of the thermoelectric device is defined by the following Equation 1.

$$ZT = \frac{\alpha^2 S\sigma ST}{K} \quad \text{[Equation 1]}$$

Here, α is a Seebeck coefficient, σ is an electric conductivity, T is an absolute temperature, and K is a thermal conductivity. Referring to Equation 1, to increase the thermoelectric performance index ZT, the Seebeck coefficient α and the electric conductivity σ need to be increased, and the thermal conductivity K needs to be decreased.

The lower electrodes 10 may be disposed at a lower portion of the thermoelectric device and electrically connected to the N-type thermoelectric material 12 and the P-type thermoelectric material 13. In addition, the plurality of lower electrodes 10 may be alternately arranged. In addition, the lower electrodes 10 may be arranged to be spaced a predetermined distance from each other.

The support layer 11 may be interposed between the N-type thermoelectric material 12 and the P-type thermoelectric material 13 coupled to the upper electrodes 14 and support the N-type thermoelectric material 12 and the P-type thermoelectric material 13. In addition, the support layer 11 may be interposed between the lower electrode 10 and the insulating layer 15 to support any one of the N-type thermoelectric material 12 and the P-type thermoelectric material 13 coupled to the lower electrode 10.

Referring to FIG. 1, the support layer 11 may be interposed between the lower electrodes 10 and the insulating layers 15 or between the N-type thermoelectric material 12 and the P-type thermoelectric material 13 of the thermoelectric device.

In addition, the support layer 11 may be interposed between the plurality of alternately arranged lower electrodes 10 to connect the lower electrodes 10, and may be formed of a polyimide-based polymer for flexibility.

Therefore, reliability of a flexible thermoelectric device can be improved with respect to bending thereof.

In addition, the support layer 11 may be inclined such that the N-type thermoelectric material 12 and the P-type thermoelectric material 13 disposed on the support layer 11 are inclined.

Referring to FIG. 1, the support layer 11 may be disposed under the N-type thermoelectric material 12 and the P-type thermoelectric material 13 and may support the N-type thermoelectric material 12 and the P-type thermoelectric material 13 in a direction perpendicular to the lower electrodes 10 and the upper electrodes 14.

The N-type thermoelectric material 12 and the P-type thermoelectric material 13 are alternately interposed between the upper electrodes 14 and the lower electrodes 10 and electrically connected to form P-N junctions.

A material used as the N-type thermoelectric material 12 and the P-type thermoelectric material 13 may include various kinds of materials, such as a metal compound or ceramic containing silicone (Si), bismuth (Bi), nickel (Ni), cobalt (Co), palladium (Pd), platinum (Pt), copper (Cu), manganese (Mg), titanium (Ti), mercury (Hg), lead (Pb), tin (Sn), molybdenum (Mo), iridium (Ir), gold (Au), silver (Ag), aluminum (Al), zinc (Zn), tungsten (W), cadmium (Cd), iron (Fe), arsenic (As), Germanium (Ge), or the like, and a conductive polymer, and each of the N-type thermoelectric material 12 and the P-type thermoelectric material 13 may include any one of the above described materials and may be formed in a thin film type.

In addition, referring to FIG. 2, a width D of each of the N-type thermoelectric material 12 and the P-type thermoelectric material 13 may be 75 µm. In addition, a thickness of each of the N-type thermoelectric material 12 and the P-type thermoelectric material 13 may be 20 µm or more. However the width and the thickness are not limited thereto.

Since a thickness of the thermoelectric material is less than a several micro meters, a total thickness of the thermoelectric device is very thin. In addition, since the thermoelectric material is very thin, there is a high possibility for the thermoelectric material to be easily formed as a flexible thermoelectric device, and since the thermoelectric material has a low internal resistance and high power density, integration thereof is simple.

In addition, the N-type thermoelectric material 12 and the P-type thermoelectric material 13 may be obliquely disposed on the support layer 11 and electrically connected to the lower electrodes 10 and the upper electrodes 14.

Accordingly, the N-type thermoelectric material 12 and the P-type thermoelectric material 13 may form predetermined angles with respect to the lower electrode 10 and the upper electrode 14, and each of the predetermined angles may be 45° or more.

Referring to FIG. 1, the N-type thermoelectric material 12 and the P-type thermoelectric material 13 may be symmetrically disposed with respect to the direction perpendicular to the upper electrode 14 and lower electrode 10.

In addition, an angle θ1 between the N-type thermoelectric material 12 and the lower electrode 10 may be 45° or more, and the angle θ1 between the N-type thermoelectric material 12 and the lower electrode 10 may be the same as an angle θ2 between the N-type thermoelectric material 12 and the upper electrode 14.

Similarly, an angle θ3 between the upper electrode 14 and the P-type thermoelectric material 14 may be the same as an angle θ4 between the lower electrode 10 and the P-type thermoelectric material 14, and may be 45° or more.

Therefore, when physical distances between the lower electrodes 10 and the upper electrodes 14 are adjusted to be widened, a thermal conduction phenomenon between the N-type thermoelectric material 12 and the P-type thermoelectric material 13 may be maximally delayed.

In addition, a first distance L1 from a portion at which the lower electrode 10 is connected to the N-type thermoelectric material 12 to a portion at which the adjacent lower electrode 10 is connected to the P-type thermoelectric material 13 may be 75 µm. In addition, in the thermoelectric device, a distance L2 between the lower electrode 10 and the upper electrode 14 may be 37.5 µm or more.

Accordingly, in a case in which the N-type thermoelectric material 12 and the P-type thermoelectric material 13 are highly integrated (a patterning density is high) and thus an area thereof is 75×75 µm$^2$, the distances between the upper electrodes 14 and the lower electrodes 10 of the thermoelectric device can be widened to increase a temperature difference of the thermoelectric device, and a thermoelectric performance index of the thermoelectric device can ultimately be improved.

In addition, in the case in which the N-type thermoelectric material 12 and the P-type thermoelectric material 13 are interposed between the upper electrodes 14 and the lower electrodes 10 in the direction perpendicular to the lower electrodes 10 and the upper electrodes 14, since a movement path of the carriers in the N-type thermoelectric material 12 and the P-type thermoelectric material 13 is formed in a direction perpendicular to a grain boundary, movement of the carriers may be interfered with. Accordingly, as the N-type thermoelectric material 12 and the P-type thermoelectric material 13 are inclined with respect to the lower electrodes 10 and upper electrodes 14, a direction of the movement path of the carriers becomes a direction parallel to the grain boundary, and thus the carriers can move smoothly and the electric conductivity σ can increase.

In addition, according to the law of Wiedemann-Franz, the electric conductivity σ and the thermal conductivity K increase at the same time, and referring to Equation 1, an effect of an increase in the thermoelectric performance index ZT due to the increase in electric conductivity σ may be offset by the thermal conductivity K.

Accordingly, a heat transfer path between the N-type thermoelectric material 12 and the P-type thermoelectric material 13 may be increased by increasing the distance between the upper electrodes 14 and the lower electrodes 10, and the increased thermal conductivity K can finally be decreased.

Therefore, the thermoelectric performance index ZT of the thermoelectric device according to the increase in electric conductivity σ can be increased by increasing the distance between the upper electrode 14 and the lower electrode 10 and maximally reducing the increase in thermal conductivity K due to the increased electric conductivity σ.

Accordingly, a temperature difference between an active cooling portion and a heat rejection portion increases in the thermoelectric device, thereby improving electricity generation and cooling performances of the thermoelectric device.

In addition, the N-type thermoelectric material 12 and the P-type thermoelectric material 13 may be interposed between the lower electrodes 10 and the upper electrodes 14 to be in parallel in the same direction. In addition, the distance between the lower electrode 10 and the upper electrode 14 may be adjusted to increase the performance index while the increase in thermal conductivity due to the increase in electric conductivity is offset as described above.

In addition, the N-type thermoelectric material 12 and the P-type thermoelectric material 13 may be disposed to have different inclination angles with respect to the lower electrodes 10 and the upper electrodes 14, and the distance between the lower electrode 10 and the upper electrode 14 may be adjusted to increase a thermal performance index.

The upper electrodes 14 may be disposed at an upper portion of the thermoelectric device and electrically connected to the N-type thermoelectric material 12 and the P-type thermoelectric material 13. In addition, similar to the lower electrodes 10, the plurality of upper electrodes 14 may be formed and alternately arranged. In addition, the upper electrodes 14 may be arranged to be spaced a predetermined distance from each other.

In addition, the lower electrodes 10 and the upper electrodes 14 may be flexible electrodes.

In addition, each of the lower electrode 10 and the upper electrode 14 may include a metal containing any one or more among copper (Cu), silver (Ag), tin (Sn), aluminum (Al), nickel (Ni), iron (Fe), gold (Au), platinum (Pt), chromium (Cr), titanium (Ti), tantalum (Ta), and tungsten (W).

The insulating layer 15 may be interposed between the upper electrodes 14, which are spaced apart from each other, and may connect the upper electrodes 14. The insulating layer 15 may be formed of a material having flexibility and insulation.

In addition, the insulating layer 15 may include polymethylmethacrylate (PMMA) and polydimethylsiloxane (PDMS) which are polymer-based materials.

In addition, the insulating layer 15 may also be formed by applying Parylene thereon. In addition, referring to FIG. 2, the insulating layer 15 may include a transparent material.

Therefore, since the highly integrated thermoelectric device has a high temperature difference and an improved thermoelectric performance index, and is formed of the flexible support layer 11 and the insulating layer 15, the thermoelectric device can have high flexibility and reliability.

In addition, the thermoelectric device illustrated in FIG. 1 may be a thin film type flexible thermoelectric device.

FIGS. 4 to 10 are cross-sectional views illustrating the thermoelectric device for describing a method of sequentially manufacturing the thermoelectric device according to one embodiment of the present invention.

A sacrificial layer 17 may be formed on a substrate 16, and the lower electrodes 10 may be formed on the sacrificial layer 17. The substrate 16 may be a rigid substrate.

Next, the N-type thermoelectric material 12 and the P-type thermoelectric material 13 configured to electrically connect the lower electrodes 10 and the upper electrodes 14 may be obliquely disposed on the lower electrodes 10.

In addition, due to the inclination, the N-type thermoelectric material 12 and the P-type thermoelectric material 13 may form a predetermined angle with respect to the lower electrode 10 and the upper electrode 14.

Figure 7:
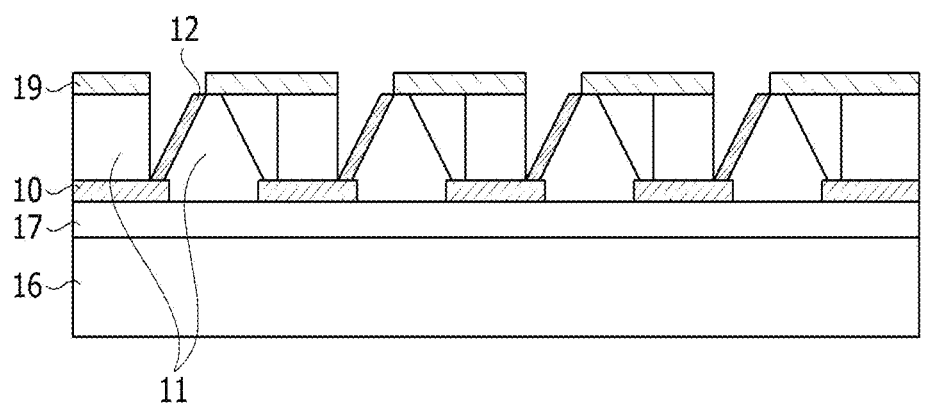
Figure 8:
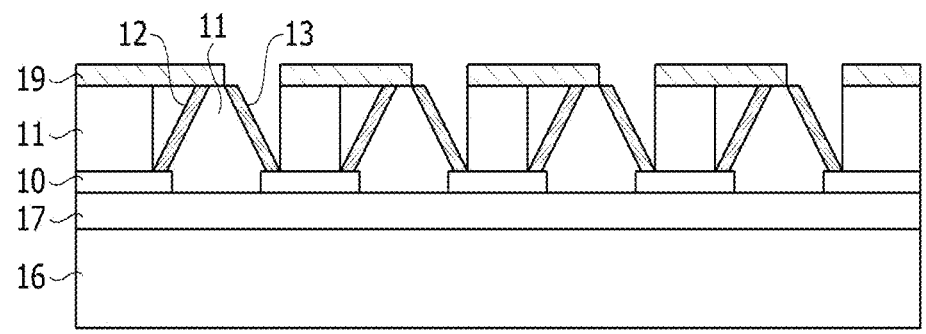
Figure 9:
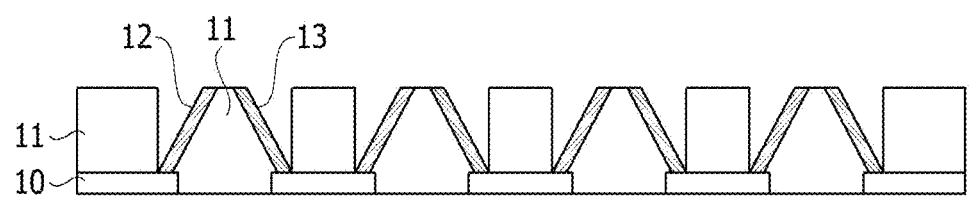
Figure 10:
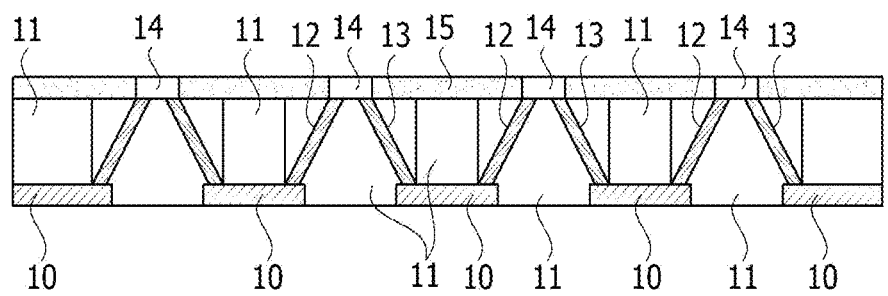

As one embodiment, the support layer 11 may be formed by injecting a polyimide into a mold 18 in an arrow direction. Accordingly, as illustrated in FIGS. 7 and 8, the N-type thermoelectric material 12 and the P-type thermoelectric material 13 may be sequentially deposited on the support layer 11 using a shadow mask 19.

In addition, the N-type thermoelectric material 12 and the P-type thermoelectric material 13 may be deposited on inclined surfaces of the support layer 11 formed using the mold 18.

In addition, a deposition order of the N-type thermoelectric material 12 and the P-type thermoelectric material 13 may also be switched.

In addition, the N-type thermoelectric material 12 and the P-type thermoelectric material 13 may be deposited on the inclined surfaces of the support layer 11 through a lithography process.

A predetermined angle is formed between the N-type thermoelectric material 12 and the P-type thermoelectric material 13 and the lower electrode 10 due to a shape of the support layer 11 according to a structure of the mold 18, and is the same as that described above.

The N-type thermoelectric material 12 and the P-type thermoelectric material 13 are deposited, and the sacrificial layer 17 is removed to separate the substrate 16 from the N-type thermoelectric material 12 and the P-type thermoelectric material 13.

In addition, the upper electrodes 14 may be connected to the N-type thermoelectric material 12 and the P-type thermoelectric material 13, and the insulating layer 15 may be formed between the upper electrodes 14 which are spaced apart from each other and may connect the upper electrodes 14.

While the present invention has been described with reference to exemplary embodiments, it will be understood by those skilled in the art that various changes and modifications may be made without departing from the spirit and scope of the present invention as defined by the appended claims.

The invention claimed is:

1. A thermoelectric device comprising:
  a plurality of lower electrodes;
  a support layer disposed on and in direct physical contact with an upper surface of the lower electrodes;
  a thermoelectric material disposed on the lower electrodes, the thermoelectric material including an N-type thermoelectric material and a P-type thermoelectric material;
  an insulating layer disposed on and in direct physical contact with an upper surface of the support layer;
  a plurality of upper electrodes disposed on the thermoelectric material;
  wherein the insulating layer, the support layer, and the lower electrodes are vertically overlapped with one another,
  wherein the thermoelectric material is electrically connected with the upper electrodes and the lower electrodes,
  wherein the thermoelectric material is inclined at a predetermined angle with respect to the lower electrodes,
  wherein the insulating layer is disposed between adjacent upper electrodes of the plurality of upper electrodes and overlaps the plurality of upper electrodes in a horizontal direction,
  wherein the support layer has a first support layer and a second support layer spaced apart from each other, wherein the thermoelectric material includes an upper surface facing the upper electrodes and a lower surface facing the lower electrodes, wherein the upper surface of the thermoelectric material is formed to gradually move away from the first support layer and from the lower electrodes toward the upper electrodes, wherein the first support layer is disposed on and in direct physical contact with upper surfaces of the plurality of lower electrodes, wherein the second support layer is in contact with the lower surface of the thermoelectric material to support the thermoelectric material, wherein a separation space is disposed between the first support layer and the N-type thermoelectric material or between the first support layer and the P-type thermoelectric material, and wherein the first and second support layers are made of a flexible material and the insulating layer is made of a material having both flexibility and insulation, the insulating layer including a transparent material.

2. The thermoelectric device of claim 1, wherein the angle between top surfaces of the lower electrodes and a lower surface of the thermoelectric material that is inclined is 45° or more.

3. The thermoelectric device of claim 2, wherein the thermoelectric material comprises a plurality of thermoelectric elements having different inclinations with respect to the lower electrodes.

4. The thermoelectric device of claim 1,
wherein the N-type thermoelectric material and the P-type thermoelectric material are symmetrical with respect to a direction perpendicular to top surfaces of the upper electrodes and top surfaces of the lower electrodes.

5. The thermoelectric device of claim 1,
wherein the first support layer is vertically overlapped with the insulating layer and disposed under the insulating layer and on the lower electrodes, wherein the second support layer is disposed between adjacent lower electrodes of the plurality of lower electrodes, and the first support layer.

6. The thermoelectric device of claim 1, wherein the insulating layer is disposed on the first support layer and horizontally interposed between adjacent upper electrodes.

7. The thermoelectric device of claim 4, wherein the first support layer is disposed on the lower electrodes and between the N-type thermoelectric material and the P-type thermoelectric material.

8. The thermoelectric device of claim 4, wherein the second support layer is inclined such that the N-type thermoelectric material and the P-type thermoelectric material disposed are inclined.

9. The thermoelectric device of claim 6, wherein the insulating layer connects the upper electrodes.

10. The thermoelectric device of claim 4, wherein an angle between bottom surfaces of the upper electrodes and an upper inclined surface of the P-type thermoelectric material is same as an angle between top surfaces of the lower electrodes and a lower inclined surface of the P-type thermoelectric material.

11. The thermoelectric device of claim 7, wherein the angle between bottom surfaces of the upper electrodes and an upper inclined surface of the P-type thermoelectric material is 45° or more.

* * * * *